United States Patent [19]

Okubo et al.

[11] Patent Number: 4,523,144
[45] Date of Patent: Jun. 11, 1985

[54] COMPLEX PROBE CARD FOR TESTING A SEMICONDUCTOR WAFER

[75] Inventors: Masao Okubo; Yasuro Yoshimitsu, both of Tokyo, Japan

[73] Assignee: Japan Electronic Materials Corp., Amagasakishi, Japan

[21] Appl. No.: 266,054

[22] Filed: May 21, 1981

[30] Foreign Application Priority Data

May 27, 1980 [JP] Japan .............................. 55-73548[U]
Jul. 3, 1980 [JP] Japan ................................. 55-91356

[51] Int. Cl.³ .......................... G01R 1/06; G01R 31/02
[52] U.S. Cl. ................................. 324/158 P; 324/72.5; 324/158 F
[58] Field of Search ................ 324/158 P, 158 F, 72.5

[56] References Cited

U.S. PATENT DOCUMENTS 3,835,381  9/1974  Garretson et al. .............. 324/158 P
3,911,361 10/1975  Bove et al. ........................ 324/158 P Primary Examiner—Ernest F. Karlsen
Attorney, Agent, or Firm—Wenderoth, Lind & Ponack

[57] ABSTRACT

A probe card includes a printed circuit plate having an aperture at the center thereof and a ring fixed around said aperture on either side of the plate. The ring is adapted to support probe needles in radial arrays with respect to the aperture. Each of the arrays has a multi-layer of probe needles which have their terminal tips aligned on a plane in parallel with the plate and their opposite terminal ends connected to the printed circuit for external connection.

1 Claim, 9 Drawing Figures

COMPLEX PROBE CARD FOR TESTING A SEMICONDUCTOR WAFER

BACKGROUND OF THE INVENTION

1. Field of the Invention

The present invention relates to a probe card used for testing semiconductor products, such as ICs and LSIs.

2. Description of the Prior Art

In the manufacture of IC and LSI products in which a number of wafer chips are fixed on a base plate, the chips are individually tested prior to cutting them. For such testing a testing device, commonly called a prober, is employed, to which a probe card is connected. The testing is effected by connecting the probe pins or needles of the card to the electrodes on the semiconductor chips.

The probe cards at the earlier stage were adapted for use in testing integrated circuits having a relative low degree of integration, or LSIs having a relatively small number of testing terminals, and accordingly, it was sufficient that the probe cards had 48 probe needles around a chip of 2 centimeters in diameter. Such a probe card is disclosed in U.S. Pat. No. 3,835,381. However, as the integrated circuits are improved to intensify their degree of integration, it is become necessary to increase the number of probe needles. Recently there has arisen a demand in the industry for fixing 300 or more probe needles in the area of 8×8 mm. In line with this industrial trend, the number of testing electrodes on a semiconductor wafer chip has become so vast that they cannot be arranged at the peripheral portion alone of the chip as under the conventional practice, and it has become necessary to fill the whole area of the chip with electrodes, regularly or irregularly.

The present invention is directed toward meeting such demand in the industry, and has for its object to provide an improved probe card for testing wafer chips for use in IC and LSI products, wherein the probe card is provided with densely arranged probe needles.

A further object of the present invention is to provide an improved probe card capable of testing a wafer chip filled with electrodes.

Other objects and advantages of the present invention will become apparent from the detailed description given hereinafter; it should be understood, however, that the detailed description and specific embodiments are given by way of illustration only, since various changes and modifications with the spirit and scope of the invention will become apparent to those skilled in the art from this detailed description.

SUMMARY OF THE INVENTION

According to one aspect of the present invention a probe card includes a printed circuit plate having an aperture at the center thereof and a ring fixed around said aperture on either side of the plate, said ring being adapted to support probe needles in radial arrays with respect to said aperture, each of said arrays consisting of a multilayer of probe needles, said probe needles having their terminal tips aligned on a plane in parallel with said plate and their opposite terminal ends connected to said printed circuit for external connection.

According to another aspect of the present invention a method of manufacturing a probe card described in the preceding paragraph comprises placing a first layer of probe needles in radial arrays on the inwardly declining surface of a manufacturing jig whose gradient is decided in accordance with the desired angle of fixture of said probe needles, and applying an applicator coated with an adhesive on its contact surface to said first layer of probe needles on said manufacturing jig, said applicator having a declining surface of the same gradient as that of said jig, allowing said adhesive to harden, repeating said procedure until the desired number of layers of probe needles are formed, and finally mounting said multilayers of probe needles integrally unified with said repeated application of adhesive on a supporting ring fixed on a base plate of said probe card.

DETAILED DESCRIPTION OF THE PREFERRED EMBODIMENTS

Figure 1:
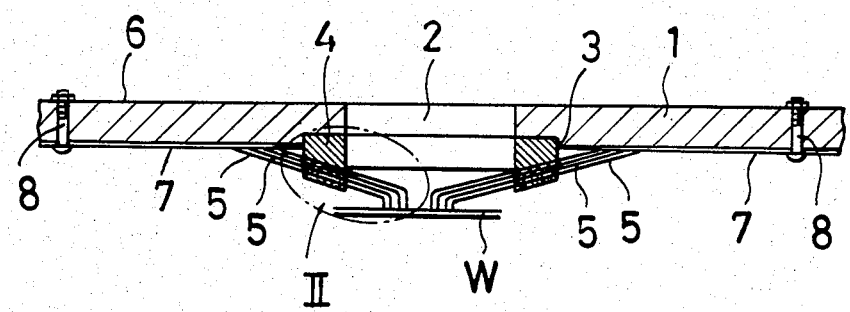
FIG. 1 is a vertical cross-section through a probe card according to the invention.

Referring to FIG. 1 a probe card includes a base plate 1, hereinafter referred to merely as the plate 1, in which a central aperture 2 and a ring-shaped depression 3 around the aperture 2 are formed. A ring 4 is fitted in the depression 3, which ring 4 is adapted to support probe needles 5 as described below. The plate 1 includes conductors 7 on its surface in which the ring 4 is fixed. The probe needles are connected to the conductors 7 at their terminal ends, and the conductors 7 are in turn connected to outside elements through bores 8. The plate 1 can be made of epoxide glass, and the ring 4 can be made of aluminium, ceramics or plastics coated with an insulator on its surface. The probe needles 5 are normally soldered to the conductors 7. A test piece (W), such as a semiconductor wafer, is placed in contact with the terminal tips of the probe needles 5.

Figure 2:
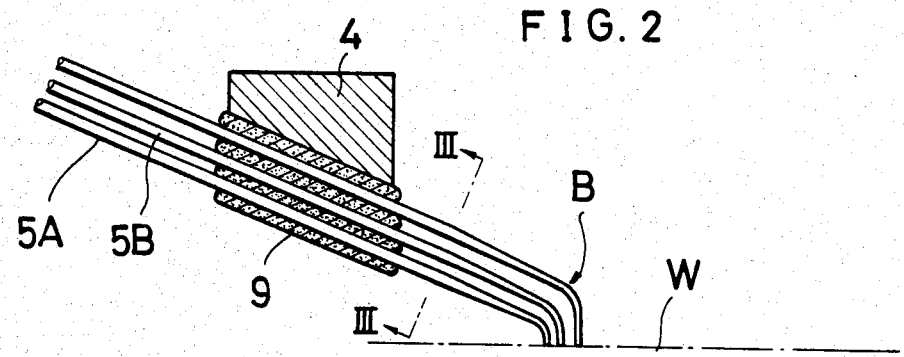
FIG. 2 is a vertical cross-section on an enlarged scale of the portion indicated by II in FIG. 1.
Figure 3:
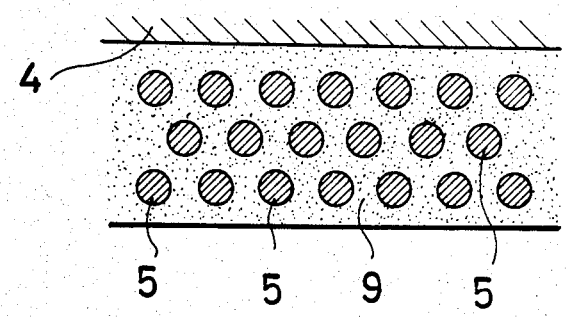
FIG. 3 is a vertical cross-section taken along the line III—III in FIG. 2.
Figure 4:
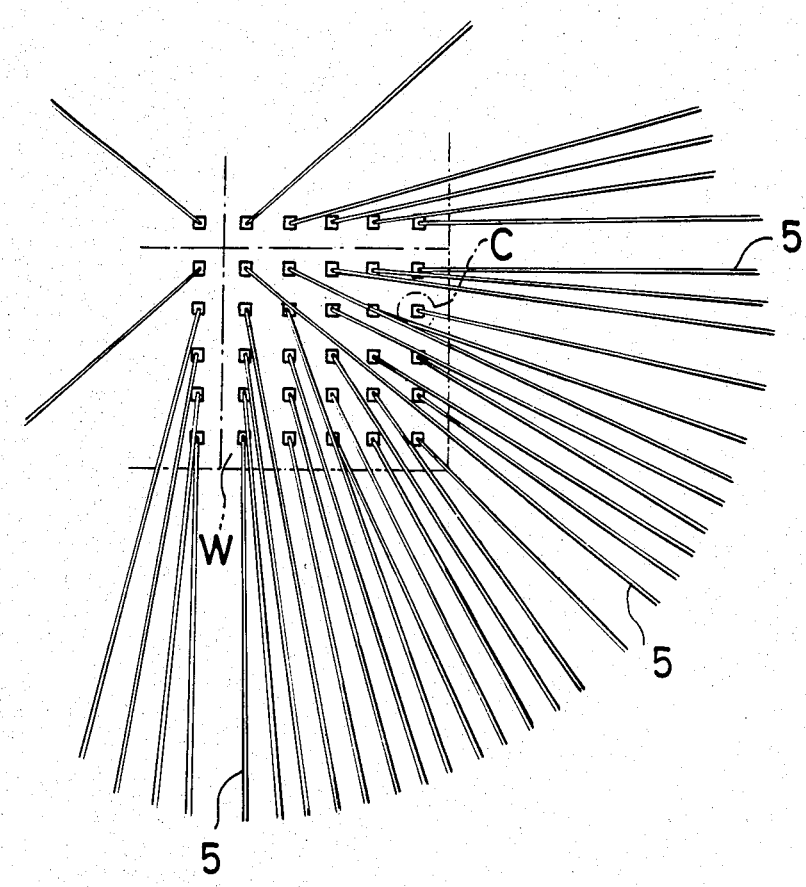
FIG. 4 is a plan view showing a semiconductor chip and the probe card of FIG. 1.

Referring to FIG. 2 the shape of each of the probe needles 5 will be explained. In the drawing the portion of each needle 5 to the left of the line III—III is straight and uniformly thick, but the portion to the right thereof tapers off towards the terminal tips with a bent portion (B). A number of probe needles 5 are supported in multilayers as shown in FIG. 2; in the illustrated embodiment only three needles 5A, 5B, etc., are shown for simplicity. The needles 5 are arranged in radial arrays on the ring 4, which means that each array consists of a plurality of layers. This is made possible by differentiating the lengths of the probe needles 5 between the ones in the inner layers 5B and in the outer layers 5A. In the illustrated embodiment the probe needles 5 in the inner layers 5B are increasingly longer than the ones in the outer layers 5A. Thus it is ensured that all the terminal tips of the probe needles 5 are aligned on one plane in parrallel with the plate 1. The probe needles 5 in the inner layers 5B are placed into contact with electrodes located at the center of a test piece (W), and the ones in the outer layers 5A are placed into contact with electrodes located at the periphery thereof. The probe needles 5 are made of tungsten, palladium or beryllium copper. The tapering portion of each needle 5 is 0.2 to 0.3 mm thick. The longer needles are made thicker than the shorter ones, so as to make the terminal tips of probe needles 5 keep contact with the test piece with an equal force of contact. Under this arrangement, when the semiconductor chip is viewed from behind the plate 1, the terminal tips of some probe needles 5 can be visually located, as shown by position (C) in FIG. 4.

In a preferred embodiment a distance between the adacent two terminal tips is about 350 micron, and 184 needles are arranged in the area of 6×6 (mm²).

Figure 7:
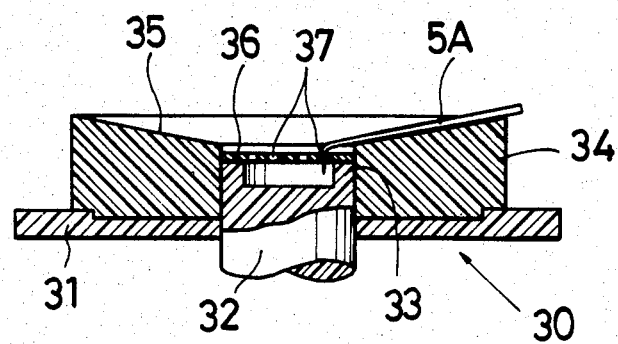
FIGS. 7 to 9 show a sequence of processes of manufacturing probe cards according to the invention.

Referring to FIG. 7, an explanation will be given about how to manufacture the probe card:

A jig 30 includes a fixed plate 31 having a post 32 erected at its center, wherein the post 32 has a ring-shaped projection 33 on its top with a circular depression therein. A supporting ring 34 is fitted to the post 32, which supporting ring 34 has an inwardly declining surface 35 on which graduations are radially formed for an index purpose. The gradient of the declinig surface 35 is decided upon, as desired. On the top of the ring-shaped projection 33 a Mylar mask 36 of about 0.15 mm (0.006 inch) in thickness is placed, in which the same number of holes 37 are made so as to accommodate the needles 5A.

Figure 8:
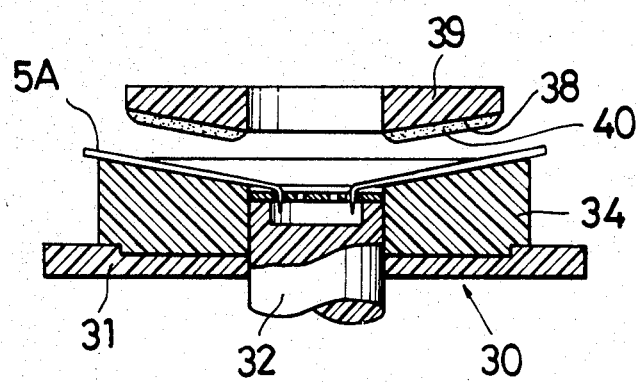
Figure 9:
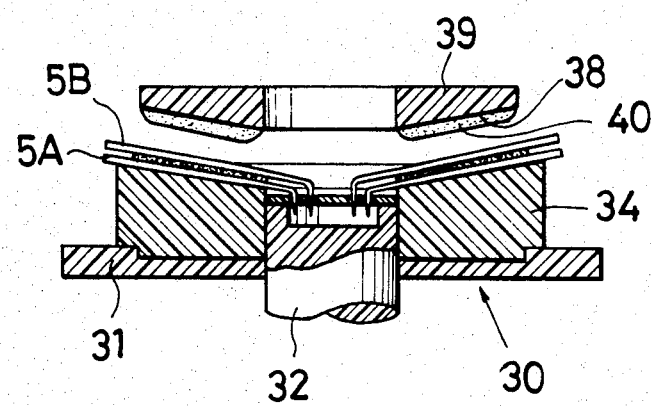

In FIG. 7 the reference numeral 5A designates the probe needles 5 located at the outermost (lowermost) position in the layer. The terminal ends of these needles 5A are inserted into the holes 37 produced in the Mylar mask 36. In this way radial arrays of the probe needles 5A are formed along the inwardly declining surface 35 of the ring 34. At this stage as shown in FIG. 8, a truncated applicator 39 is pressed onto the ring 34. The applicator 39 has a declining surface 38 of the same gradient as that of the supporting ring 34. The declining surface 38 of the applicator 39 is coated with an adhesive 40 containing a parting agent. For the adhesive 40 an epoxide resin can be used. The applicator 39 and the ring 34, as jointed, are heated at 70° C. to 90° C. in an electric furnace for 2 to 3 hours, thereby allowing the adhesive 40 to harden. Then they are taken away from the electric furnace, and the applicator 39 is disengaged from the ring 34. In this way a desired number of needles 5 are overlaid so as to form multilayers, wherein the needles 5 are insulated from each other. FIG. 9 shows a situation in which a second layer 5B is overlaid on the first layer 5A with an insulator located therebetween. The probe needles 5 are integrally unified with the repeated application of adhesive 40 one layer 5B after another layer 5A, and are partly embedded in an adhesive layer 9 (FIG. 2) placed on the supporting ring 4, wherein the adhesive 40 (FIG. 8) no longer contains a parting agent so as to fix the probe needles 5A, 5B, etc., permanently. The adhesive 9 (FIG. 2) is allowed to harden by heat, and the jig 30 is removed. Finally, the terminal tips of the probe needles 5 are pointed. The supporting ring 4 with the multilayers of probe needles 5 suspended therefrom (FIGS. 1 and 2) is fitted in the ring-shaped depression 3 of the plate 1. The terminal end of each probe needle 5 is connected to a printed circuit or any other element.

As evident from the foregoing, the probe card has thick layers of probe needles 5, but the terminal tips of some probe needles 5 can be visually located from both behind and in front of the plate 1, whereby the visual adjustment of these probe needles 5 to the electrodes on a wafer chip can be readily made. With this visual location, the whole adjustment to the other electrodes thereon finishes. This greatly enhances the working efficiency.

This example of a first embodiment can be modified by providing a further supporting ring 4 (FIG. 1) around the back of the central aperture 2, and adding one or more layers of probe needles 5 thereto.

Figure 5:
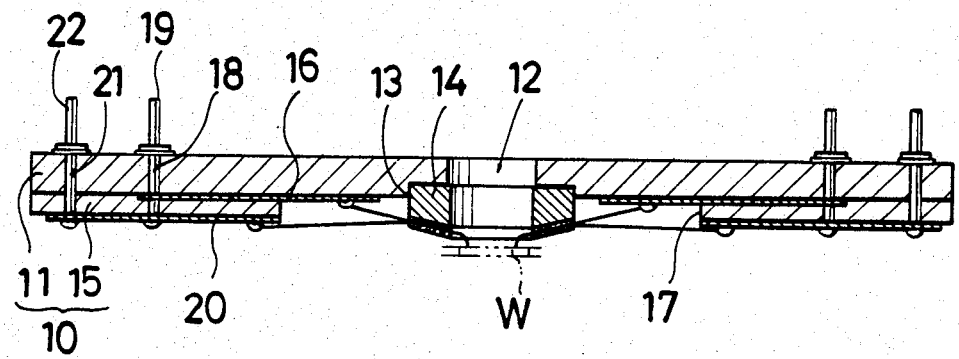
FIG. 5 is a vertical cross-section through an alternative embodiment of the invention.
Figure 6:
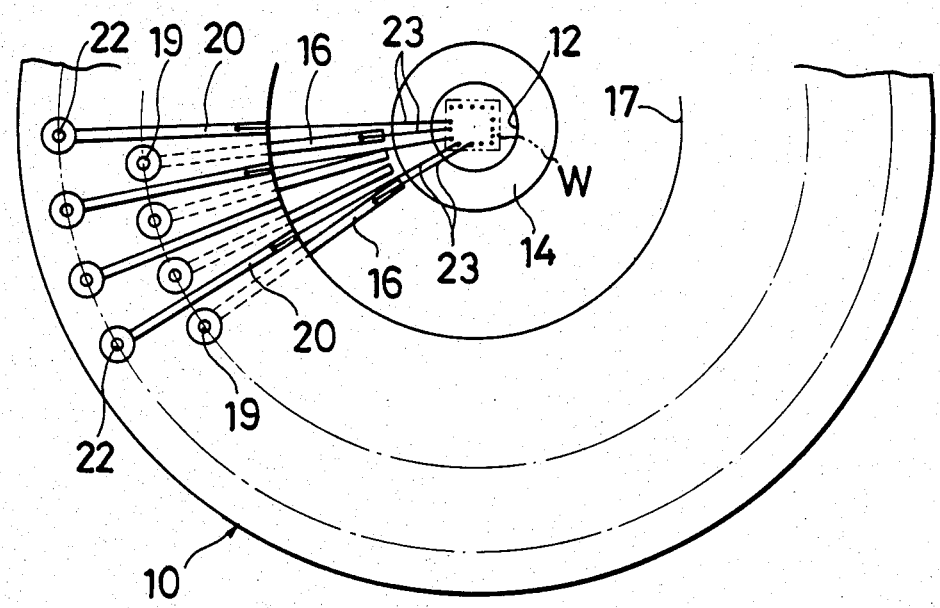
FIG. 6 is a plan view showing the probe card, partly omitted, of FIG. 5.

Referring now to FIGS. 5 and 6, a further alternative embodiment will be described:

In this embodiment, a base plate 10, hereinafter referred to merely as the plate 10, is made up of an inner plate 11 and an outer plate 15. The inner plate 11 has a central aperture 12 and a ring-shaped depression 13 in which a ring 14 is fitted for supporting probe needles 23 (FIG. 6). The outer plate 15 has an aperture 17 of sufficient area to allow conductors 16 placed on the inner plate 11 to expose each central portion therethrough. Both apertures 12 and 17 are concentric but the aperture 17 is larger than the aperture 12. Each conductor 16 is radially fixed to the inner plate 11, and is connected to each terminal rod 19 for external connection, wherein the terminal rods 19 are supported in bores 18 produced throughout the plates 11 and 15. The terminal rods 19 are insulated from conductors 20 placed on the outer plate 15. It is arranged that the conductors 16 and 20 do not come into any contact with each other. Each conductor 20 is connected to each terminal rod 22 passing through a bore 21 produced throughout the plates 11 and 15. The probe needles 23 (FIG. 6) are arranged in radial arrays on the ring 14 in the same manner as described with respect to the first embodiment. The terminal ends of the probe needles 23 are connected to the conductors 16 and 20. Likewise, the probe needles 23 are arranged in multilayers by differentiating their length in the same manner as described above.

For a further modified version of this second embodiment the plates 11 and 15 can number more than two.

What is claimed is:

1. A probe card for testing semiconductor wafers comprising:
    a printed circuit plate having an aperture at the center thereof and a ring fixed around said aperture on a bottom side of said printed circuit plate,
    said ring having an underside with an inwardly declining surface,
    probe needles arranged in radial arrays with respect to said aperture, each of said radial arrays having multiple layers of probe needles,
    an adhesive layer for suspending said multiple layers of probe needles parallel to the inwardly declining surface of said ring,
    said probe needles having tapered terminal tips aligned on a plane in parallel with but spaced from said printed circuit plate and opposite uniformly thick terminal ends connected to said printed circuit plate for external connection,
    wherein said probe needles in inner layers are longer than said probe needles in outer layers, and
    wherein said aperture is large sufficiently to allow said tapered terminal tips of said probe needles to be visually located and readily adjusted from both behind and in front of said printed circuit plate.

* * * * *